United States Patent
Choi

(10) Patent No.: US 11,342,838 B2
(45) Date of Patent: May 24, 2022

(54) SYSTEM OF CONTROLLING CHARGING APPARATUS FOR VEHICLE

(71) Applicants: Hyundai Motor Company, Seoul (KR); Kia Motors Corporation, Seoul (KR)

(72) Inventor: Gyu Tae Choi, Suwon-si (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 492 days.

(21) Appl. No.: 16/420,517

(22) Filed: May 23, 2019

(65) Prior Publication Data

US 2020/0186024 A1   Jun. 11, 2020

(30) Foreign Application Priority Data

Dec. 6, 2018 (KR) .................. 10-2018-0155919

(51) Int. Cl.
| | |
|---|---|
| *H02M 1/00* | (2006.01) |
| *H02M 1/42* | (2007.01) |
| *B60L 53/22* | (2019.01) |
| *G01R 19/165* | (2006.01) |
| *B60L 53/14* | (2019.01) |
| *H02M 1/12* | (2006.01) |

(52) U.S. Cl.
CPC .......... *H02M 1/4225* (2013.01); *B60L 53/14* (2019.02); *B60L 53/22* (2019.02); *G01R 19/165* (2013.01); *B60L 2210/30* (2013.01); *H02M 1/0009* (2021.05); *H02M 1/12* (2013.01)

(58) Field of Classification Search
CPC .... H02M 1/4225; H02M 1/0009; H02M 1/12; H02M 1/0025; H02M 1/32; B60L 53/14; B60L 53/22; B60L 2210/30; B60L 53/20; B60L 3/0023; G01R 19/165; Y02T 10/70; Y02T 10/7072; Y02T 90/14; Y02T 10/72; B60Y 2200/91; B60Y 2200/92; B60Y 2400/3084; B60Y 2400/3086; Y02B 70/10
USPC ........................................................ 320/109
See application file for complete search history.

(56) References Cited

U.S. PATENT DOCUMENTS

| | | | |
|---|---|---|---|
| 2011/0156643 A1* | 6/2011 | Chen ........................ | B60L 58/20 320/109 |
| 2013/0049674 A1* | 2/2013 | Davis ...................... | H02J 7/025 320/101 |
| 2016/0294291 A1* | 10/2016 | Oh .......................... | H02M 1/14 |

FOREIGN PATENT DOCUMENTS

KR          10-1866095 B1     6/2018

* cited by examiner

*Primary Examiner* — Paul Dinh
(74) *Attorney, Agent, or Firm* — Morgan, Lewis & Bockius LLP

(57) ABSTRACT

A system of controlling a charging apparatus for a vehicle may include a power supply unit supplying an AC power, a power factor correction (PFC) converter unit connected to the power supply unit and converting the AC power supplied from the power supply unit into a DC power and supplying the converted DC power to a load, and a controller extracting a high frequency component from the AC power input to the PFC converter unit, determining a frequency of the extracted high frequency component, and limiting, when the determined frequency is equal to or greater than a predetermined value, output power from the PFC converter unit to a value lower than the predetermined value.

12 Claims, 4 Drawing Sheets

SYSTEM OF CONTROLLING CHARGING APPARATUS FOR VEHICLE

CROSS REFERENCE TO RELATED APPLICATION

The present application claims priority to Korean Patent Application No. 10-2018-0155919, filed Dec. 6, 2018, the entire contents of which is incorporated herein for all purposes by this reference.

BACKGROUND OF THE INVENTION

Field of the Invention

The present invention relates to a system of controlling a charging apparatus for a vehicle, and more particularly, to a system of controlling a charging apparatus for a vehicle, capable of preventing input of overcurrent to a power factor correction (PFC) converter unit by limiting an output from the PFC converter unit according to high frequency components included in alternating current (AC) power supplied from a power supply unit and limiting an input current input to the PFC converter unit on the basis of the limited output.

Description of Related Art

Generally, electric vehicles or plug-in hybrid vehicles include an energy storage device (e.g., a battery) for receiving AC system power using a charging facility and storing the received AC power. To charge the energy storage device, a vehicle may include a charging apparatus configured for converting the AC system power provided from the external charging facility into direct current (DC) power having a desired magnitude.

The charging apparatus provided in a vehicle is known as an onboard charger (OBC) and may include a PFC converter for correcting a power factor of input AC power to generate a DC voltage and a DC-DC converter converting a magnitude of an output voltage from the PFC converter into a magnitude of a voltage required for charging the battery.

Meanwhile, the conventional development tendency of the PFC converter was reducing a size of a magnetic substance and a size of a single product by increasing a pulse width modulation (PWM) switching frequency of a switching element included in the PFC converter. However, according to the generally used conventional technique, a control period of PFC must be shortened as a PWM frequency is increased, but in actuality, it is impossible to control PFC by 1 period per period of PWM. To overcome the present limitation, a technique of controlling PFC by 1 period per three periods of PWM has been developed, but in the case of the PFC converter using an external power source as a power source, if distorted power is applied due to a state of the external power source, responding performance of a controller is decreased, causing an input overcurrent phenomenon.

The information included in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a system of controlling a charging apparatus configured for a vehicle, configured for preventing input of overcurrent to a power factor correction (PFC) converter unit by limiting an output from the PFC converter unit according to high frequency components included in alternating current (AC) power supplied from a power supply unit and limiting an input current input to the PFC converter unit on the basis of the limited output.

According to an exemplary embodiment of the present invention, a system of controlling a charging apparatus configured for a vehicle may include: a power supply unit supplying an AC power; a power factor correction (PFC) converter unit connected to the power supply unit and converting the AC power supplied from the power supply unit into a DC power and supplying the converted DC power to a load; and a controller extracting a high frequency component from the AC power input to the PFC converter unit, determining a frequency of the extracted high frequency component, and limiting, when the determined frequency is equal to or greater than a predetermined value, output power from the PFC converter unit to a value lower than the predetermined value.

The system may further include: a rectifier positioned between the power supply unit and the PFC converter unit and rectifying the AC power input from the power supply unit.

The PFC converter unit may include: an inductor to which rectified power from the rectifier is input; a switching element connected to the inductor in parallel; a diode connected to the inductor in series; and a capacitor connected to the switching element in parallel.

The system may further include: a current sensor configured for detecting a current input to the inductor; a first voltage sensor configured for detecting a voltage of the capacitor; and a second voltage sensor configured for detecting a voltage input to the PFC converter unit.

The controller may include: a first filter unit filtering a high frequency ripple component included in the AC power input to the PFC converter unit to extract a high frequency greater than a preset value; a first frequency determining unit determining a frequency of the extracted high frequency; and a first output limiting unit limiting, when the determined frequency of the extracted high frequency is equal to or greater than a predetermined frequency value, output power from the PFC converter unit to a predetermined output power value.

The controller may be configured to control output power of the PFC converter unit by limiting an input current reference input to the PFC converter unit on the basis of the predetermined output power value.

The controller may be configured to determine an input power input to the PFC converter unit by dividing the predetermined output power value by predetermined efficiency of the charging apparatus configured for a vehicle, and derive an input current limiting value by dividing the input power by the detected input voltage of the PFC converter unit.

The controller may be configured to determine the frequency of the high frequency on the basis of equation below:

$$\text{Frequency} = 1/(\text{cumulative counting number} \times T) \quad [\text{Equation}]$$

Here, T denotes a period during which a voltage input to the PFC converter unit is detected, and the cumulative counting number denotes a number obtained by accumulating the times when the detected voltage value input to the PFC converter unit is equal to a predetermined reference voltage value during one period in which the voltage input to the PFC converter unit is detected.

The controller may compare a currently detected voltage value of the voltage input to the PFC converter unit with a previously detected voltage value and determine whether to increase the counting number or whether to store the cumulative counting number and perform initialization.

The controller may increase the counting number when the currently detected voltage value is smaller than the previously detected voltage value, and store the cumulative counting number and perform initialization when the currently detected voltage value is greater than the previously detected voltage value.

The controller may extract a low frequency component from the AC power input to the PFC converter unit, determine a frequency of the extracted low frequency component, and limit an output of the PFC converter unit to a value lower than a predetermined value when the determined frequency is lower than the predetermined value.

The controller may further include: a second filter unit filtering a low frequency ripple component included in the AC power input to the PFC converter unit to extract a low frequency lower than a preset value; a second frequency determining unit determining a frequency of the extracted low frequency; and a second output limiting unit limiting output power of the PFC converter unit to a predetermined output value when the determined frequency has a value lower than the predetermined frequency value.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
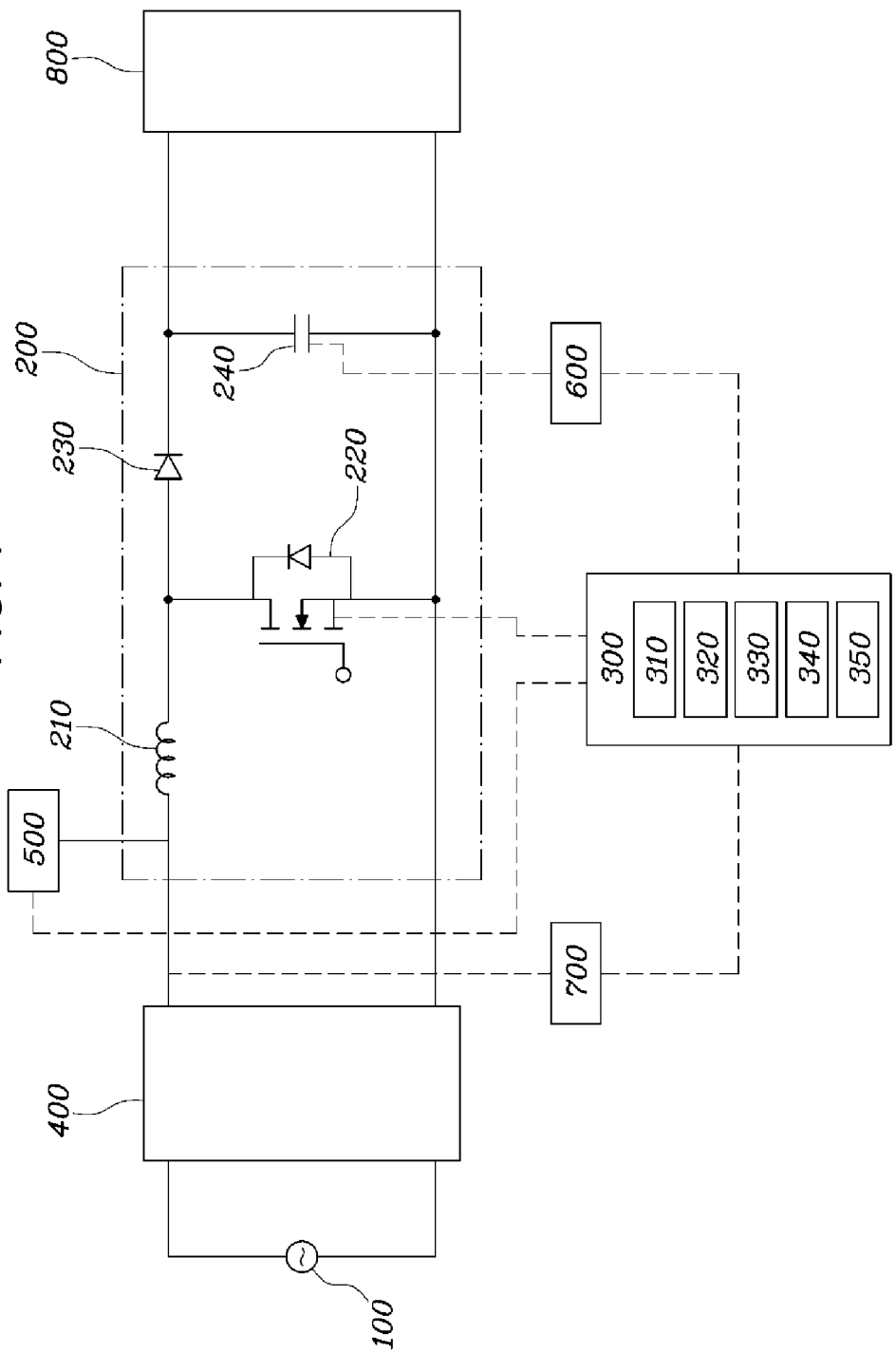
FIG. 1 is a view exemplarily illustrating a configuration of a system of controlling a charging apparatus configured for a vehicle according to an exemplary embodiment of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, embodiments of the present invention will be described in detail with reference to the accompanying drawings.

Figure 2:
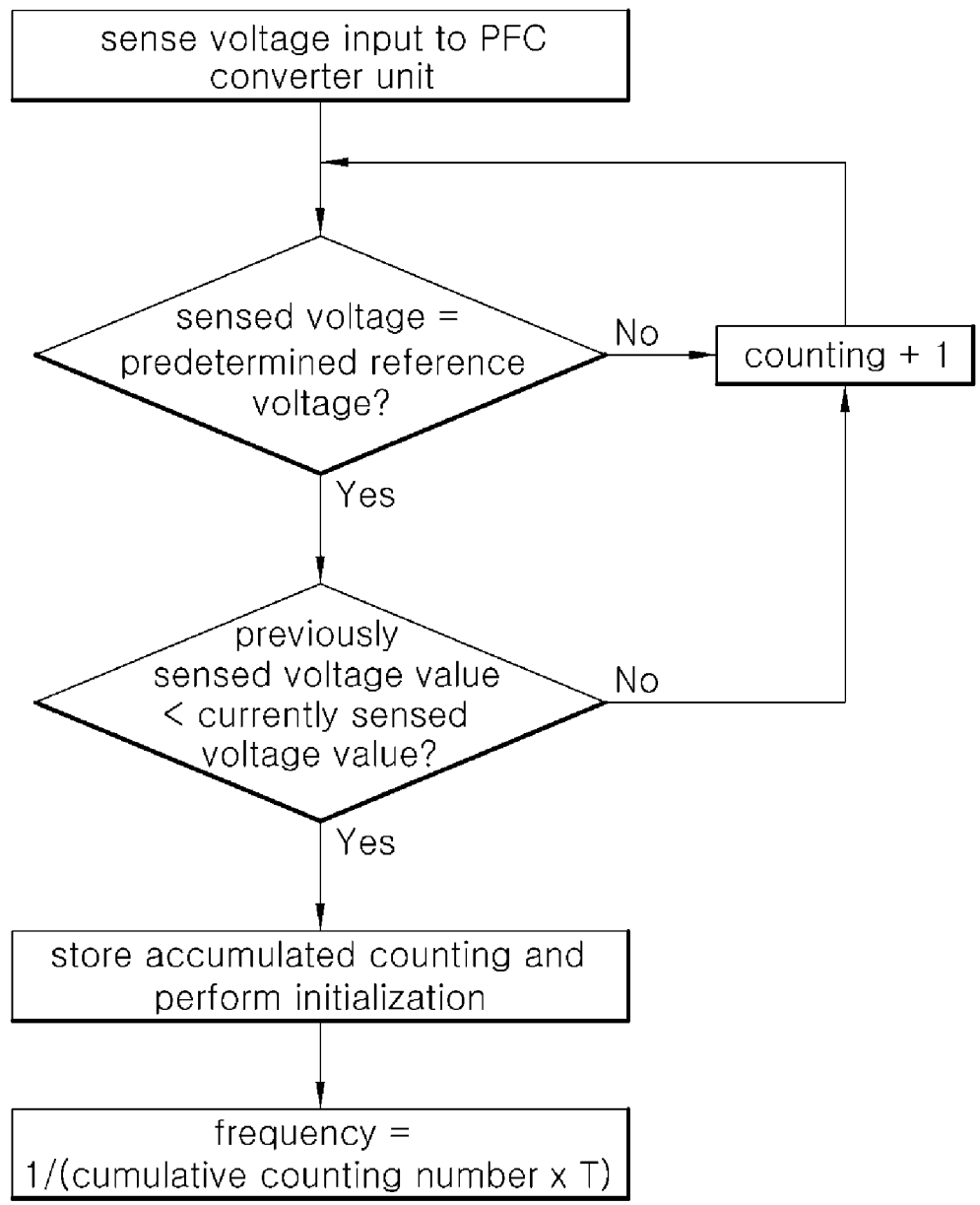
FIG. 2 is a flowchart of deriving a frequency from a controller in a system of controlling a charging apparatus configured for a vehicle according to an exemplary embodiment of the present invention.
Figure 3:
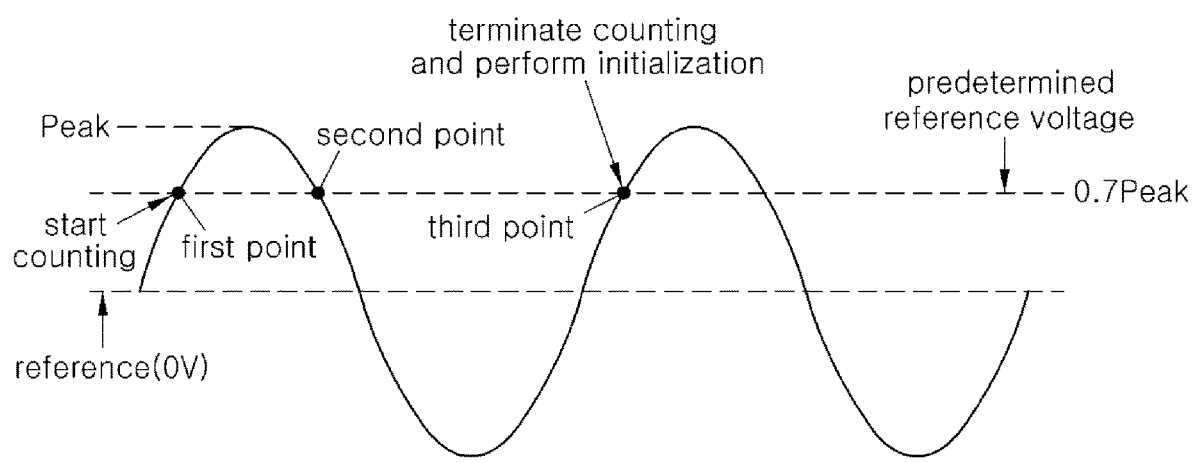
FIG. 3 is a view exemplarily illustrating a start point and an end point of counting in a system of controlling a charging apparatus configured for a vehicle according to an exemplary embodiment of the present invention.
Figure 4:
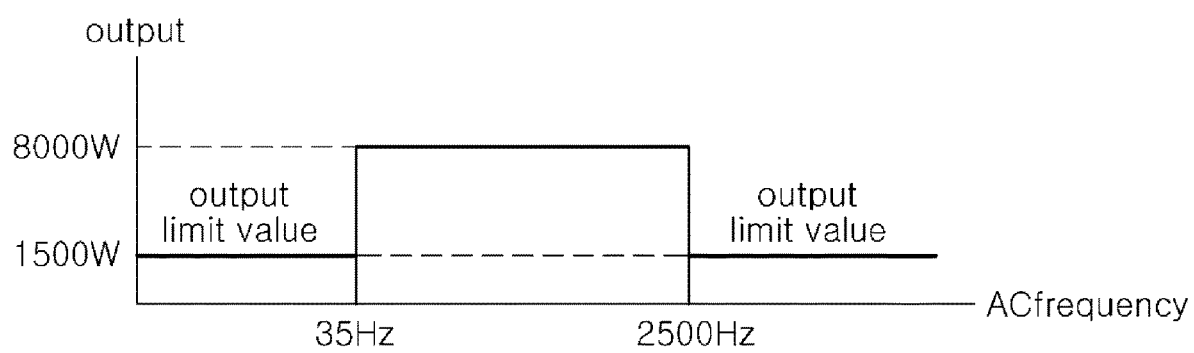
FIG. 4 is a view exemplarily illustrating output power of a power factor correction (PFC) converter unit limited when a determined frequency is lower than a predetermined frequency or equal to or greater than the predetermined frequency in a system of controlling a charging apparatus configured for a vehicle according to the exemplary embodiment of the present invention.

FIG. 1 is a view exemplarily illustrating a configuration of a system of controlling a charging apparatus configured for a vehicle according to an exemplary embodiment of the present invention, FIG. 2 is a flowchart of deriving a frequency from a controller, FIG. 3 is a view exemplarily illustrating a start point and an end point of counting, and FIG. 4 is a view exemplarily illustrating output power of a power factor correction (PFC) converter unit limited when a determined frequency is lower than a predetermined frequency or equal to or greater than the predetermined frequency.

Referring to FIG. 1, a system of controlling a charging apparatus configured for a vehicle according to an exemplary embodiment of the present invention may include a power supply unit 100, a PFC converter unit 200, and a controller 300, and may further include a rectifier 400, a current sensor 500, a first voltage sensor 600, and a second voltage sensor 700.

The rectifier 400 is disposed between the power supply unit 100 and the PFC converter unit 200 and rectifies AC power input from the power supply unit 100. Although not shown, the rectifier 400 may include a plurality of diodes allowing current to pass therethrough only in one direction and rectify an AC voltage. According to an exemplary embodiment of the present invention, the rectifier 400 may include four diodes, and one end portion of an AC power source may be connected between two diodes connected in series to rectify the corresponding AC power.

The current sensor 500 detects a current input to an inductor 210 included in the PFC converter unit 200 (to be described later), the first voltage sensor 600 is configured to detect a voltage of a capacitor 240 included in the PFC converter unit 200, and the second voltage sensor 700 is configured to detect a voltage input to the PFC converter unit 200.

The power supply unit 100 is configured to supply AC power to the charging apparatus configured for a vehicle. According to an exemplary embodiment of the present invention, the power supply unit 100 may be a charging facility of a charging station configured for supplying AC power to the charging apparatus configured for a vehicle or a charging facility disposed at home.

The PFC converter unit 200 converts the AC power supplied from the power supply unit 100 into DC power and supplies the converted DC power to a load 800 mounted on the vehicle. Here, the load 800 mounted on the vehicle may include an energy storage device (e.g., a battery) for receiving power from the power supply unit and storing the same and various electronic/electric components, or the like, required for driving the vehicle.

As illustrated in FIG. 1, the PFC converter unit 200 may include an inductor 210 to which power rectified by the rectifier 400 is input, a switching element 220 connected to the inductor 210 in parallel, a diode 230 connected to the switching element 210 in series, and a capacitor 240 connected to the switching element 220 in parallel. Here, the switching element 220 may be a transistor according to an exemplary embodiment of the present invention, and here, one end portion of the transistor may be connected between the inductor 210 and the diode 230 and the other end portion thereof may be connected to one end portion of a capacitor 240. Furthermore, a switching signal (pulse width modulation (PWM) signal) controlled by a controller 300 (to be described later) may be applied to a gate terminal of the transistor. That is, the transistor may be operated according to the switching signal applied from the controller 300, and the controller 300 may control output power of the PFC converter unit 200 by controlling the operation of the transistor.

The PFC converter unit 200 may generate a DC voltage by correcting a power factor of power input from the rectifier 400 on the basis of the detailed components described above. The technique of generating the DC voltage by correcting the power factor of the AC power in the PFC converter unit 200 on the basis of the above-described components is a known technique, and thus a detailed description thereof will be omitted.

The controller 300 extracts a high frequency component from the AC power input to the PFC converter unit 200 and determines a frequency of the extracted high frequency component. If the determined frequency is equal to or greater than a predetermined value, the controller 300 is configured to limit output power of the PFC converter unit 200 to a value lower than the predetermined value. Also, the controller 300 extracts a low frequency component from the AC power input to the PFC converter unit 200 and determines a frequency of the extracted low frequency component. If the determined frequency is lower than a predetermined value, the controller 300 may limit output power of the FPC converter unit 200 to a value lower than the predetermined value.

The controller 300 may include a first filter unit 310, a first filter unit 310 filtering a high frequency ripple component included in the AC power input to the PFC converter unit 200 to extract a high frequency, a first frequency determining unit 320 determining a frequency of the extracted high frequency from the first filter unit 310, and a first output limiting unit 330 limiting output power of the PFC converter unit 200 to a predetermined output power value when the frequency determined by the first frequency determining unit 320 is equal to or greater than a predetermined frequency value. Here, the first filter unit 310 may be a high pass filter (HPF) according to an exemplary embodiment of the present invention.

The controller 300 may further include a second filter unit 340 filtering a low frequency ripple component included in the AC power input to the PFC converter unit 200 and extracting a low frequency, a second frequency determining unit 350 determining a frequency of the extracted low frequency from the second filter unit 340, and a second output limiting unit 360 limiting output power of the PFC converter unit 200 to a predetermined output power value when the frequency determined by the second frequency determining unit 350 is lower than a predetermined frequency value. Here, the second filter unit 340 may be a low pass filter (LPF) according to an exemplary embodiment of the present invention.

Hereinafter, a configuration in which the controller derives a frequency of the high frequency on the basis of the above-described components, compares the derived frequency of the high frequency with a predetermined frequency, and limits output power of the PFC converter unit according to a comparison result will be described in detail with reference to FIG. 2, FIG. 3 and FIG. 4.

The controller 300 may determine a frequency of the high frequency extracted through the first filter unit 310 on the basis of the following equation.

$$\text{Frequency} = 1/(\text{cumulative counting number} \times T) \quad \text{[Equation]}$$

Here, T denotes a period during which a voltage input to the PFC converter unit is detected, and the counting number denotes a number obtained by accumulating times when the detected voltage value input to the PFC converter unit is equal to a predetermined reference voltage value during one period in which the voltage input to the PFC converter unit is detected.

According to an exemplary embodiment of the present invention, the predetermined reference voltage value may be 0.7 peak value with respect to a peak value of a voltage input to the PFC converter unit. Here, the reference voltage value previously set for determining the frequency of the high frequency may be different from the reference value previously set for determining the frequency of the low frequency.

Referring to FIG. 2, in detail, the controller 300 compares the voltage input to the PFC converter unit 200 which has been detected by the second voltage sensor 700 and transmitted to the PFC converter unit 200 with a predetermined reference voltage value. If the transmitted voltage input to the PFC converter unit 200 is equal to a predetermined reference voltage value, the controller 300 may compare a currently detected voltage value of the voltage input to the FPC converter unit 200 with a previously detected voltage value and determine whether to increase the counting number or whether to store the cumulative counting number and perform initialization. For example, when the voltage input to the PFC converter unit 200 is equal to the predetermined reference voltage value, if the currently detected voltage value is smaller than the previously detected voltage value, the controller 300 may increase the counting number, and when the currently detected voltage value is greater than the previously detected voltage value, the controller 300 may store the cumulative counting number and perform initialization.

Referring to FIG. 3, counting may start from a first point at which a voltage input to the PFC converter unit 200 is first equal to a predetermined reference voltage value. Also, at a second point at which the voltage input to the PFC converter unit 200 is equal to the predetermined reference voltage value, a currently detected voltage value of the voltage input to the PFC converter unit 200 is smaller than a previously detected voltage value, the controller 300 may increase counting by '1'. Furthermore, at a third point at which the voltage input to the PFC converter unit 200 is equal to the predetermined reference voltage value, the currently detected voltage value of the voltage input to the PFC converter unit 200 is greater than the previously detected voltage value, and thus, the controller 300 may store the accumulated counting values and perform initialization. Also, the controller 300 may store the counting number accumulated according to the method described above and determine a frequency of the high frequency extracted through the first filter unit 310 on the basis of the equation described above, i.e., frequency=1/(counting number×T). For example, when T is 20 us and the cumulative counting number stored as described above is 2, the frequency may be determined as 1/(2×20 us) (frequency=1/(2×20 us)).

Meanwhile, when the determined frequency is equal to or greater than the predetermined frequency value, the controller 300 may limit output power of the PFC converter unit 200 to a predetermined output power value. Referring to FIG. 4, for example, when the determined frequency is 2500 Hz or higher, the controller 300 may limit output power of the PFC converter unit 200 to 1500 W.

Furthermore, the controller 300 may control output power of the PFC converter unit 200 by limiting an input current reference input to the PFC converter unit 200 on the basis of the predetermined output power limit value. Although not shown, the controller 300 may include a voltage controller and a current controller. The voltage controller may extract an input current reference upon receiving a voltage reference and the voltage value of the capacitor 240 detected by the first voltage sensor 600. The current controller may extract a switching signal (PWM signal) to be applied to the switching element 220 included in the PFC converter unit 200 upon receiving the input current reference extracted by the voltage controller and a current value of the inductor 210 detected by the current sensor 500, and the controller 300 may control output power of the PFC converter unit 200 by driving the switching element 220 on the basis of the extracted switching signal (PWM signal).

The controller 300 may determine an input power input to the PFC converter unit 200 by dividing the predetermined output power value by a predetermined efficiency of the charging apparatus configured for a vehicle and derive an input current limit value by dividing the determined input power by an input voltage of the PFC converter unit 200 detected by the second voltage sensor 700. Here, the charging apparatus configured for a vehicle may be an on-board charger (OBC), and the input current limit value may be an input reference value input to the current controller. In other words, when the determined frequency is equal to or greater than the predetermined value, the controller 300 may limit output power of the PFC converter unit 200 to the predetermined value and limit an input current input to the PFC converter unit 200 on the basis of the limited output power value, and thus, input of an overcurrent to the PFC converter unit 200 may be prevented.

Meanwhile, the configuration in which the controller derives the frequency of the low frequency, compares the derived frequency with the predetermined frequency, and limits the output power of the PFC converter unit according to the comparison result is the same in technical features as the configuration in which the controller derives the frequency of the high frequency, compares the derived frequency with the predetermined frequency, and limits the output power of the PFC converter unit according to the comparison result, and thus, a detailed description thereof will be omitted.

According to an exemplary embodiment of the present invention, since output of the PFC converter unit is limited according to the high-frequency component included in the AC power supplied from the power supply unit and the input current to the PFC converter unit is limited on the basis of the limited output, input of an overcurrent to the PFC converter unit may be prevented.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures.

It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A system of controlling a charging apparatus for a vehicle, the system comprising:
    a power supply unit supplying an AC power;
    a power factor correction (PFC) converter unit connected to the power supply unit and converting the AC power supplied from the power supply unit into a DC power and supplying the converted DC power to a load;
    a controller extracting a high frequency component from the AC power input to the PFC converter unit, determining a frequency of the extracted high frequency component, and limiting, when the determined frequency is equal to or greater than a predetermined value, output power from the PFC converter unit to a value lower than the predetermined value,
    wherein the PFC converter unit includes:
        an inductor to which rectified power from a rectifier is input;
        a switching element connected to the inductor in parallel;
        a diode connected to the inductor in series; and
        a capacitor connected to the switching element in parallel,
    a current sensor detecting a current input to the inductor;
    a first voltage sensor detecting a voltage of the capacitor; and
    a second voltage sensor detecting a voltage input to the PFC converter unit.

2. The system of claim 1,
    wherein the rectifier is disposed between and connected to the power supply unit and the PFC converter unit to rectify the AC power input from the power supply unit.

3. The system of claim 1, wherein the controller includes:
    a first filter unit filtering a high frequency ripple component included in the AC power input to the PFC converter unit to extract a high frequency greater than a preset value;
    a first frequency determining unit determining a frequency of the extracted high frequency; and
    a first output limiting unit limiting, when the determined frequency of the extracted high frequency is equal to or greater than a predetermined frequency value, an output power from the PFC converter unit to a predetermined output power value.

4. The system of claim 3,
    wherein the controller is configured to control an output power of the PFC converter unit by limiting an input current reference input to the PFC converter unit on a basis of the predetermined output power value.

5. The system of claim 3,
wherein the controller is configured to determine an input power input to the PFC converter unit by dividing the predetermined output power value by predetermined efficiency of the charging apparatus for the vehicle, and to derive an input current limiting value by dividing the input power by a detected input voltage of the PFC converter unit.

6. The system of claim 3,
wherein the controller is configured to determine the frequency of the extracted high frequency on a basis of equation below:

$$\text{Frequency} = 1/(\text{cumulative counting number} \times T) \quad \text{[Equation]}$$

wherein T denotes a period during which a voltage input to the PFC converter unit is detected, and the cumulative counting number denotes a number obtained by accumulating times when the detected voltage value input to the PFC converter unit is equal to a predetermined reference voltage value during one period in which the voltage input to the PFC converter unit is detected.

7. The system of claim 6, wherein the predetermined reference voltage value is a predetermined peak value with respect to a peak value of the voltage input to the PFC converter unit.

8. The system of claim 6,
wherein the controller is configured to compare a currently detected voltage value of the voltage input to the PFC converter unit with a previously detected voltage value and to determine when a counting number is increased or when the cumulative counting number is stored and initialization is performed.

9. The system of claim 8,
wherein the controller is configured to increase the counting number when the currently detected voltage value is smaller than the previously detected voltage value, and to store the cumulative counting number and to perform the initialization when the currently detected voltage value is greater than the previously detected voltage value.

10. The system of claim 1,
wherein the controller is configured to extract a low frequency component from the AC power input to the PFC converter unit, determines a frequency of the extracted low frequency component, and limits an output of the PFC converter unit to a value lower than a predetermined value when the determined frequency is lower than the predetermined value.

11. The system of claim 10, wherein the controller further includes:
a second filter unit filtering a low frequency ripple component included in the AC power input to the PFC converter unit to extract a low frequency lower than a preset value;
a second frequency determining unit determining a frequency of the extracted low frequency; and
a second output limiting unit limiting the output power of the PFC converter unit to a predetermined output value when the determined frequency has a value lower than a predetermined frequency value.

12. The system of claim 1, wherein the controller further includes:
a voltage controller extracting an input current reference upon receiving a voltage reference and a voltage value of the capacitor detected by the first voltage sensor; and
a current controller extracting a switching signal to be applied to the switching element upon receiving the input current reference extracted by the voltage controller and a current value of the inductor detected by the current sensor, and
wherein the controller controls the output power of the PFC converter unit by driving the switching element on a basis of the extracted switching signal.

* * * * *